United States Patent [19]

Federico et al.

[11] 4,137,428

[45] Jan. 30, 1979

[54] OPTICALLY ACTUATED BIDIRECTIONAL SEMICONDUCTOR SWITCH

[75] Inventors: Joseph Federico, Berkeley Heights; Stephen Knight, Murray Hill; Sigurd G. Waaben, Princeton, all of N.J.

[73] Assignee: Bell Telephone Laboratories, Incorporated, Murray Hill, N.J.

[21] Appl. No.: 845,930

[22] Filed: Oct. 27, 1977

[51] Int. Cl.² ............................................. H03K 17/78
[52] U.S. Cl. ............................... 179/1 SW; 307/117; 307/311; 307/315
[58] Field of Search ............ 179/1 SW; 307/315, 311, 307/117; 328/2

[56] References Cited

PUBLICATIONS

Motorola, "MOC 3000-3003," Data Sheet, Oct. 1975.
Western Electric, "2B Opto-Isolator," Data Sheet, Mar. 1976.
C. Bussolati, et al., "An Optoelectronic Switch etc.," IEEE Trans. on I and M, Jun. 1977, pp. 105-109.
J. Biard, et al., "Optoelectronics etc.," Proc. IEEE, Dec. 1964, pp. 1529-1536.

Primary Examiner—William C. Cooper
Assistant Examiner—E. S. Kemeny
Attorney, Agent, or Firm—David I. Caplan

[57] ABSTRACT

An optically controlled bidirectional (bilateral) electrical switch is formed by a pair of photo-Darlington devices connected in series opposing (back-to-back) relationship between the two controlled terminals of the switch. Each of these photo-Darlington devices is shunted by a separate unidirectional diode element, such as a PN junction diode, arranged to conduct current only in the opposite direction from that of current flow through the corresponding shunted photo-Darlington device in its "on" condition. Four embodiments are shown.

14 Claims, 6 Drawing Figures

OPTICALLY ACTUATED BIDIRECTIONAL SEMICONDUCTOR SWITCH

FIELD OF THE INVENTION

This invention relates to the field of semiconductor apparatus, and more particularly, to optically actuated semiconductor switching apparatus.

BACKGROUND OF THE INVENTION

In the prior art, it has been suggested to use optically controlled semiconductor transistor switching devices, in order to afford electrical isolation between the control signal circuit and the controlled circuit. For example, in a paper by J. R. Biard et al., "Optoelectronics as Applied to Functional Electronic Blocks," *Proceedings of the IEEE*, Vol. 52, pp. 1529–1536 (1964), at p. 1533, several forms of optically actuated transistor (phototransistor) switching devices were proposed for bidirectional control of electrical current flow. However, these proposals suffered from a limitation on the controlled voltage to 100 volts or less, owing to the problem of transistor breakdown caused by buildup of base-emitter voltage during the "off" condition of the switching devices. Moreover, the proposals in the prior art involving the back-to-back (series opposing) connection of a pair of photo-transistors between the terminals of the controlled circuit suffered from the requirement of fabricating a transistor with a breakdown voltage of greater than about 6 volts in combination with a sufficiently high inverse gain factor (inverse alpha) greater than about 0.99 in order to yield switchable (controlled) currents of reasonably high values, i.e., of about 100 milliamperes, thereby imposing a severe limitation upon the controlled voltage in the "off" condition. Accordingly, it would be desirable to have an optically controlled semiconductor switching device that avoids the shortcomings of the prior art, that is, a switch that can withstand at least about 200 volts in the "off" condition and can handle currents of 100 milliamps in the "on" condition.

SUMMARY OF THE INVENTION

An optically controllable semiconductor switching device is formed by a pair of back-to-back photo-Darlington devices connected between a pair of terminals to be controlled by the switching device, each photo-Darlington device being shunted by a separate unidirectional current inhibiting diode element, such as a PN junction diode. Each such shunting diode element is connected across the corresponding photo-Darlington device such that, with respect to current flow from one of the controlled terminals to the other, the forward direction of the thus shunted photo-Darlington is opposite to the forward direction of the said diode. During operation, a D.C. bias voltage modulated by an A.C. signal voltage is applied across the controlled terminals such that when sufficient optical radiation is directed on both photo-Darlingtons, the instantaneous voltage drop across these terminals is substantially insensitive to the instantaneous amplitude of the A.C. signal voltage, that is, the D.C. bias is sufficient to drive a D.C. current component through a current path through one of the diodes and one of the photo-Darlingtons in their respective forward directions such that the "saturation" region (of appreciable current, but not necessarily "saturated" current) of the photo-Darlington is reached in the presence of the optical radiation. By "optical" radiation is meant the infra-red, visible, and ultra-violet regions of the electromagnetic spectrum.

In a specific integrated circuit embodiment of the invention, a pair of photo-Darlingtons is integrated in an N type silicon epitaxial layer. Each photo-Darlington consists essentially of a Darlington-connected pair of bipolar NPN transistors, each transistor having been formed at a major surface of the epitaxial layer by an N-type localized emitter zone which has been produced by introduction of donor impurities into larger P-type diffused base zone, in accordance with standard techniques in the art. Each of the photo-Darlingtons is connected by metallization to a separate localized P-type zone in the same epitaxial layer, in order to provide the shunting unidirectional diodes. Ohmic contacts to these latter P-type zones furnish the external access terminals of the resulting switching device in accordance with the invention.

BRIEF DESCRIPTION OF THE DRAWING

This invention together with its features, advantages, and objects may be better understood from the following Detailed Description when read in conjunction with the drawings in which.

Only for the sake of clarity, none of the drawings is to scale.

DETAILED DESCRIPTION

Figure 1:
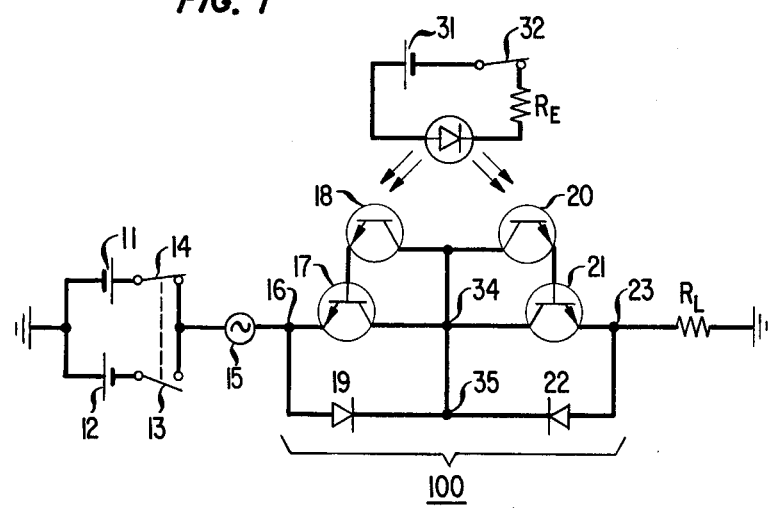
FIG. 1 is a schematic circuit diagram of an optically controlled semiconductor bidirectional switching device in accordance with a specific embodiment of the invention.

As illustrated in FIG. 1, an optically controlled semiconductor switching device 100 is provided by a first photo-Darlington pair of bipolar transistors 17 and 18, connected in back-to-back relationship with a second photo-Darlington pair of bipolar transistors 20 and 21 connected between controlled terminals 16 and 23. Each of the photo-Darlingtons is shunted by a separate unidirectional current inhibiting elements 19 and 22, respectively, connected back-to-back between the controlled terminals 16 and 23 to pass current in the opposite sense from each corresponding respective shunted photo-Darlington. These photo-Darlingtons are located typically in a single optical cavity to receive optical radiation emitted by a light emitting diode (LED) device 33 in response to the closing of a switch 32 in series with a resistor $R_E$ and a voltage source 31 suitable for driving the LED. Alternatively, the LED device can be a pair of series connected light emitting diodes, each located in a separate optical cavity containing a different one of the photo-Darlingtons. It should be understood of course that the switch 32 can take many forms, such as a suitable transistor driver, with suitable control circuitry as known in the art, for various desired LED characteristics. The circuit shown in FIG. 1 further includes a load $R_L$ as well as A.C. signal source 15 together with D.C. bias voltage sources 11 and 12 of opposite polarity either of which can be switched into series relationship with the A.C. source by means of the switches 13 and 14 which are "ganged" together. The A.C. signal source 15 can typically take the form of an electrical signal which constitutes an analog or other signal representation of a human voice signal. A load $R_L$, typically a telephone receiver, completes the electrical circuit of D.C. bias 11 or 12, A.C. signal 15, optically controlled switch 100, and said load.

The switch 100 can be turned "on" during operation by means of the incidence upon both transistors 18 and 20 of sufficient optical radiation emitted by the LED 33. It should be understood, of course, that, while not as practical for simple operation, this optical radiation need fall only upon one of the transistors 18 or 20 depending upon the polarity of the D.C. battery 11 or 12 which is then switched into the circuit by the (ganged) switch 14 or 13.

Figure 2:
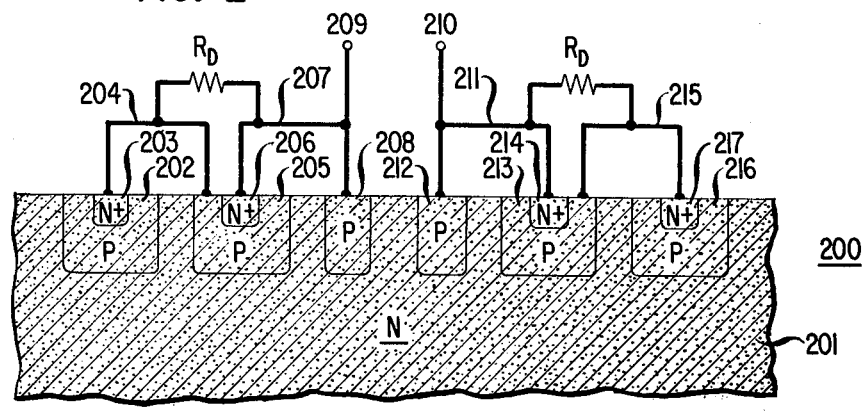
FIG. 2 is a cross-section diagram of a specific integrated circuit realization of the foregoing switching device of the invention.

FIG. 2 illustrates a semiconductor integrated circuit realization 200 of the switching device 100 (FIG. 1). Terminals 209 and 210 in FIG. 2 correspond, respectively, to the terminals 16 and 23 of FIG. 1. The integrated circuit switching device 200 is formed in an N type semiconductor layer 201 which, for example, can be an epitaxial layer of about 40 ohm-cm bulk resistivity. This layer 210 is typically about 30 to 50 micron in thickness as formed by epitaxial growth on a major surface of an N+ monocrystalline silicon body of about 0.001 ohm-cm bulk resistivity. There are a total of six P-type localized zones 202, 205, 208, 212, 213, 216 contiguous with a major surface 201.5 of the body 201. The P-zones 202, 205, 213, and 216 are diffused base zones of the type suitable for NPN bipolar Darlington transistors, as known in the art; whereas the P-zones 208 and 212 are diffused zones suitable for unidirectional current inhibiting P-N junction diodes, also as known in the art. All six P-zones can be formed simultaneously by known geometrically selective diffusion of acceptor impurities through the major surfaces 201.5 of the layer 201 to a limited depth of typically about 3 micron.

By way of illustration only, the P zones 208 and 212 of the diodes have cross-section areas of about $2 \times 10^{-4}$ square centimeter; the P zones 205 and 213 (corresponding to the base zones of the transistors 17 and 21 of FIG. 1) have cross-section areas of about $6 \times 10^{-3}$ square centimeter each; the P zones 202 and 216 have cross-section areas of about $10^{-2}$ square centimeter each; and all six of these P zones have a net significant acceptor impurity concentration of typically about $10^{18}$ boron nuclei per cubic centimeter. The N+ zones 206 and 214 (corresponding to the emitter zones of the transistors 17 and 21) have cross sections of about $8 \times 10^{-4}$ square centimeter each; the N+ zones 203 and 217 have cross sections of about $11 \times 10^{-4}$ square centimeter; and all four of these N+ zones have a net significant donor impurity concentration of typically about $3 \times 10^{19}$ phosphorus nuclei per cubic centimeter to a depth of about 1.5 micron.

The P zone 205 is electrically connected by metallization 204 to the N zone 203, in order to form the Darlington-type configuration shown in FIG. 1 (emitter of transistor 18 connected to base of transistor 17). The N+ zone 206 is connected by metallization 207 to the P-zone 208 and to terminal 209, to complete the left-hand side of the integrated circuit configuration 200 of which the remaining right-hand side is a mirror image. A resistor $R_D$ can be connected between metallization 204 and 207, which is optional for the purpose of adjusting time constants and for furnishing leakage paths in the "off" condition of the switching device 200.

It should be understood that conventional "field-plate overlap" of the high voltage silicon device technology should be used in connection with an overlap of the metallizations in insulating relationship to the underlying P-N junctions, in order to regularize the electric field profile and to prevent premature breakdown. The edges of the P-N junctions should be contoured so as to prevent sharp corners which would cause undesirable increased fields and premature breakdown, as known in the art. In addition, N+ guard rings and/or dielectric isolation fabrication techniques can be used to electrically isolate each transistor and diode from its neighbor. Such isolation is useful to prevent undesired latching in the "on" condition that may otherwise occur by virtue of the PNPN structure inherently formed by, for example, zones 206, 205, 201, and 212.

Figure 3:
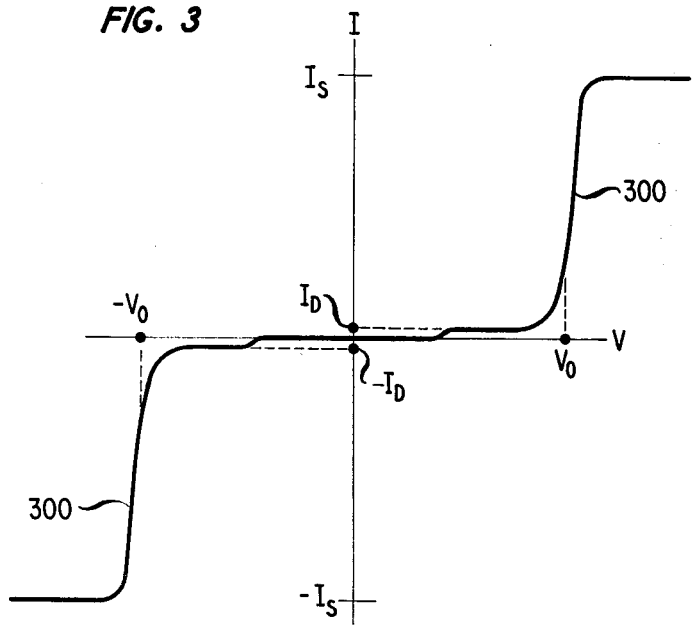
FIG. 3 is an I-V characteristic of the switching circuit shown in FIG. 1.

FIG. 3 shows an I-V curve 300 characteristic of the switching device 100 (built with discrete circuit elements), that is, current vs. voltage across the terminals 23 and 16 in an "on" condition of the device (when the switch 32 is in the closed position). The curve is symmetrical about the origin, and is characterized by a slow and slight increase in current at a voltage of about 0.6 to 0.7 volts and a relatively rapid and large (exponential) increase in current at a voltage of $V_O$ about 1.5 volts. The "saturation" current $I_S$ is of the order of 100 milliamperes whereas the "deadzone" current $I_D$ is about 2 milliamp for typical levels of illumination produced by an LED current 10 milliamperes. For switching purposes, therefore, the switching device 100 should be in a circuit with a load $R_L$ selected such that "load line" in conjunction with a D.C. voltage bias (battery 11 or 12 in FIG. 1) is such that during operation the intersections of this load line with the curve 300 ("operating points") always correspond to at least about 1.5 volts or more for all A.C. signals (from the source 15 in FIG. 1), that is, the operating points are in the so-called "saturation region" of the switch where the current increases rapidly with voltage. In this manner, the instantaneous voltage drop across the terminals of the switching device 100 is substantially insensitive to the instantaneous amplitude of A.C. signal current, which is desirable for an ideal distortion-free switch.

The curve 300 illustrated in FIG. 3 was obtained in conjunction with optical radiation incident on the device 100 emitted by a pair of LEDs connected in series with a D.C. voltage source providing an LED current of 10 milliamperes, each LED being located in a separate optical cavity containing a different one of the photo-Darlingtons. The saturation current $I_S$ through the device 100 was about 100 milliamperes. In the "off" condition, i.e., no light directed on the device 100, and with a load $R_L$ of 1,000 ohm, for all voltages across the device greater than about 1.5 volts and less than about 200 volts, the current in the load $R_L$ was 90 dB less than the current during the "on" condition with the 10 milliamp LED current. Thus, a D.C. bias of at least about 1.5 or 1.6 volt is a suitable voltage of the voltage sources 11 and 12 for use with the switching device 100.

Figure 4:
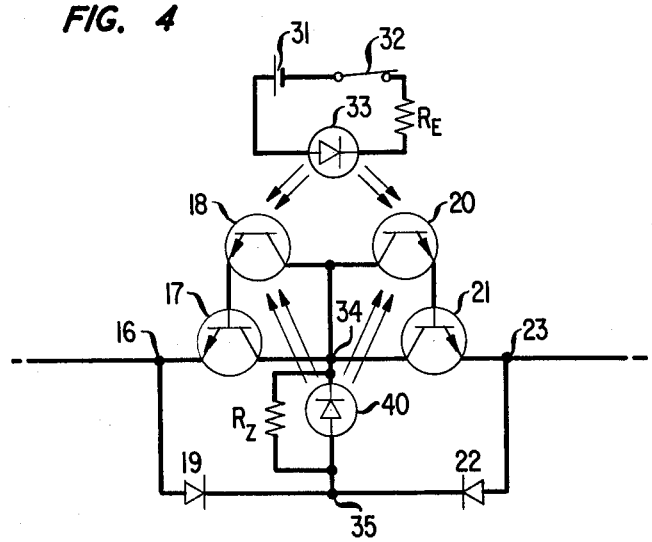
FIG. 4 is a schematic circuit diagram of an optically controlled semiconductor bidirectional switching device in accordance with another embodiment of the invention.

As shown in FIG. 4, the circuit shown in FIG. 1 can be modified by the addition of an auxiliary LED 40 in parallel with an auxiliary resistor $R_Z$ between nodes 34 and 35. In this way, the switching device can be made to stay "on" (to "latch") whenever the voltage across the terminals 16 and 23 exceeds a certain value as determined by the value of $R_Z$. This latching feature is useful, for example, to prevent overdrive of the transistors in the presence of sudden current surges in the controlled external circuit. A typical useful value of $R_Z$ is about 10 ohms for a typical operating current for the switch of about 100 milliamperes; so that the ordinary operating voltage drop across the auxiliary LED 40 is less than the typical turn-on voltage of 1.5 volt, and thus during ordinary operation no latching occurs.

Figure 5:
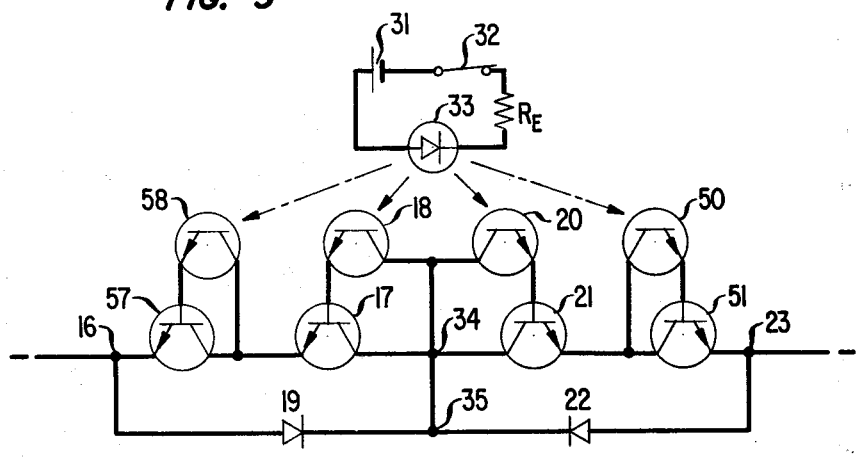
FIG. 5 is a schematic circuit diagram of an optically controlled semiconductor bidirectional switching device in accordance with another embodiment of the invention.
Figure 6:
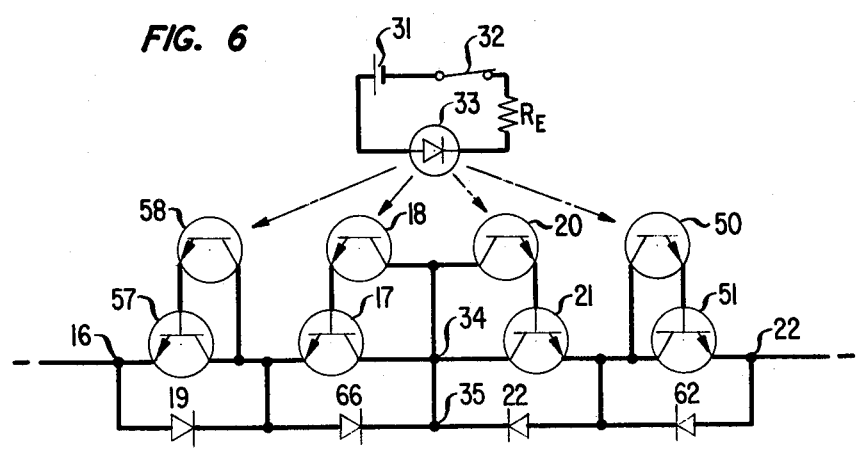
FIG. 6 is a schematic circuit diagram of an optically controlled semiconductor bidirectional switching device in accordance with another embodiment of the invention.

The circuit shown in FIG. 5, with two series-aiding Darlingtons per side of the switch (four Darlingtons in all), is useful for maintaining lower operating voltage drops per transistor. However, in such a case, the diodes 19 and 22 may tend to be overdriven (breakdown) unless the diodes be made of larger size (area). This required size (area) increases more than linearly with voltage, thereby increasing unduly the required semiconductor chip area. On the other hand, the circuit shown in FIG. 6, with a separate diode per Darlington, avoids the need for such large sized diodes.

Instead of allowing the node 35 to float electrically, a positive voltage source, typically of about 400 volts, can be connected through an impedance, of typically the order of 10 megohms, to this node; thereby, the diodes 16 and 22 (plus 62 and 66) are backbiased to a greater impedance and hence these diodes provide for a smaller (capacitive) leakage current during the "off" state of the switch. In case the switching device 100 is to be used in conjunction with an A.C. source 15 of high frequency (above about 100 KHz), this 10 megohm impedance can advantageously be a switched impedance, in order to provide a low impedance leakage path to ground for signal current otherwise passing through the parasitic capacitance of the diodes into the load $R_L$ when the switching device 100 is "off". Specifically, for example, this switched impedance can be furnished by an auxiliary PNP bipolar transistor whose "off" impedance is about 10 megohms; the node 35 is connected to the collector terminal of this PNP transistor; the base terminal of this PNP transistor is connected to a node in the control circuit containing the LED 33 such that this PNP transistor is turned "on" when the LED is "off" and the transistor is turned "off" when the LED is "on"; and the emitter terminal of this PNP transistor is connected in series with an auxiliary resistor of about 5,000 ohms and a D.C. voltage source of 400 volts to ground. Thereby, when the LED is "on" and hence the switching device 100 is also "on", this PNP transistor is "off" and presents a relatively high impedance of about 10 megohms between the node 35 and ground; when the LED and hence also the switching device 100 are "off", the PNP transistor together with the auxiliary resistor present a relatively low impedance of about 5,000 ohms to ground, thus providing the desired leakage path to ground for signals coming from the A.C. source.

Although the invention has been described in detail in terms of specific embodiments, various modifications can be made without departing from the scope of the invention. For example, the photo-Darlington transistors that are connected back-to-back can be connected emitter-to-emitter rather than collector-to-collector. Moreover, PNP bipolar transistors can be used instead of NPN transistors.

What is claimed is:

1. Semiconductor apparatus which comprises:
    (a) first and second photo-Darlington transistor devices connected series opposing between, respectively, first and second terminals;
    (b) a first unidirectional diode element connected across the first photo-Darlington device for conducting current between the first and second terminal in the opposite source of direction from that of the first photo-Darlington device;
    (c) a second unidirectional element connected across the second photo-Darlington device for conducting current between the first and second terminals in the opposite sense of direction from that of the second photo-Darlington device.

2. Apparatus according to claim 1 in which the first photo-Darlington device includes at least two series-aiding photo-Darlingtons, each of said photo-Darlingtons consisting essentially of a first transistor whose emitter is electrically connected directly to the base of a second transistor and whose collector is electrically connected directly to the collector of the said second transistor.

3. Apparatus according to claim 1 which further includes light emitting means for directing optical radiation on the first and second photo-Darlington devices in order to turn "on" both said photo-Darlington devices in response to a signal applied to said light emitting means.

4. Apparatus according to claim 1 in which the first and second terminals are subjected to an A.C. voltage and a D.C. voltage thereacross.

5. Apparatus according to claim 3 which further includes a load a D.C. source, and an A.C. source connected in series between said first and second terminals.

6. Apparatus according to claim 1 which further includes means for directing optical radiation on said first and second photo-Darlington devices.

7. Semiconductor apparatus according to claim 1 in which the first and second diode elements are PN junction diodes.

8. Semiconductor apparatus according to claim 7 in which the first and second PN junction diodes are integrated in a single crystal silicon semiconductor body in which the first and second photo-Darlington devices are integrated.

9. Apparatus which comprises:
    (a) first and second controlled terminals;
    (b) first and second photo-Darlington devices connected in series opposing relationship between said first and second terminals;
    (c) first PN junction diode connected in shunt relationship across the first photo-Darlington device, such that the forward current flow direction of the said first diode is opposite to that of the said first photo-Darlington device;
    (d) a second PN junction diode connected in shunt relationship across the second photo-Darlington device, such that the forward current flow direction of the said second diode is opposite to that of the said second photo-Darlington device.

10. Apparatus according to claim 9 which further includes:
    means for directing optical radiation on the first and second photo-Darlington devices sufficient to turn "on" both said photo-Darlington devices simultaneously into their saturation characteristic.

11. Apparatus according to claim 10 which further includes means for simultaneously applying a D.C. bias voltage and an A.C. signal voltage across said first and second terminals, said D.C. bias voltage being sufficient to drive a sufficient D.C. current component through a current path from the first terminal to the second terminal so that the instantaneous voltage drop across said first and second terminals is substantially insensitive to the instantaneous amplitude of the A.C. signal voltage, said current path including one of said diodes in its forward direction and one of said photo-Darlington devices in its forward direction.

12. A system for telephone communications which includes:
  (a) apparatus according to claim 10;
  (b) a D.C. voltage source in series with an electrical signal source, for producing electrical signals representative of voice signals with a D.C. bias on an electrical line connected to said first terminal; and
  (c) an electrical load device, connected to said second terminal, for converting the electrical signals with the D.C. bias into audible acoustic wave signals.

13. A system for telephone communication which includes:
  (a) apparatus according to claim 8;
  (b) a D.C. voltage source in series with an electrical signal source, for producing electrical signals representative of voice signals with a D.C. bias on an electrical line connected to said first terminal; and
  (c) an electrical load device, connected to said second terminal, for converting the electrical signals with the D.C. bias into audible acoustic wave signals.

14. Semiconductor apparatus comprising:
  (a) first and second terminals;
  (b) first and second photo-Darlingtons connected in series-aiding between said first terminal and an electrical node;
  (c) third and fourth photo-Darlingtons connected in series-aiding between said node and said second terminal, said third and fourth photo-Darlingtons in series-opposing relation to said first and second photo-Darlingtons; and
  (d) first, second, third, and fourth diodes connected in shunt relationship separately, respectively, across said first, second, third, and fourth photo-Darlingtons, each said diode for conducting current only in the opposite sense of direction from that conducted by the photo-Darlington which said diode shunts, respectively.

* * * * *